US009859349B2

(12) United States Patent
Li et al.

(10) Patent No.: US 9,859,349 B2
(45) Date of Patent: Jan. 2, 2018

(54) ORGANIC ELECTROLUMINESCENT DISPLAY SUBSTRATE AND MANUFACTURING METHOD THEREOF, AND DISPLAY DEVICE

(71) Applicant: BOE Technology Group Co., Ltd., Beijing (CN)

(72) Inventors: Yansong Li, Beijing (CN); Na Li, Beijing (CN); Li Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/913,037

(22) PCT Filed: Jul. 31, 2015

(86) PCT No.: PCT/CN2015/085769
§ 371 (c)(1),
(2) Date: Feb. 19, 2016

(87) PCT Pub. No.: WO2016/155175
PCT Pub. Date: Oct. 6, 2016

(65) Prior Publication Data
US 2017/0040396 A1    Feb. 9, 2017

(30) Foreign Application Priority Data

Apr. 1, 2015    (CN) .......................... 2015 1 0151619

(51) Int. Cl.
*H01L 27/32*    (2006.01)
*H01L 51/56*    (2006.01)
(Continued)

(52) U.S. Cl.
CPC .......... *H01L 27/3258* (2013.01); *H01L 27/32* (2013.01); *H01L 51/0014* (2013.01);
(Continued)

(58) Field of Classification Search
CPC ............ H01L 27/3258; H01L 51/5234; H01L 51/5228; H01L 51/0021; H01L 51/0014;
(Continued)

(56) References Cited

U.S. PATENT DOCUMENTS

| 2004/0130614 A1 | 7/2004 | Valliath et al. |
| 2008/0298571 A1 | 12/2008 | Kurtz et al. |
| 2011/0204369 A1* | 8/2011 | Ha ...................... H01L 51/5228 257/59 |

FOREIGN PATENT DOCUMENTS

| CN | 101615624 A | 12/2009 |
| CN | 101645489 A | 2/2010 |

(Continued)

OTHER PUBLICATIONS

International Search Report and Written Opinion for International Patent Application No. PCT/CN2015/085769, dated Nov. 6, 2015, 10 pages.

(Continued)

*Primary Examiner* — Donald Raleigh
*Assistant Examiner* — Kevin Quarterman
(74) *Attorney, Agent, or Firm* — Westman, Champlin, Koehler, P.A.

(57) ABSTRACT

The present disclosure provides an organic electroluminescent display substrate and a manufacturing method thereof, and a display device. The organic electroluminescent display substrate includes a base substrate and a plurality of pixel units formed on the base substrate, the pixel unit including a light-emitting region and a non-light-emitting region. An organic electroluminescent structure is formed in the light-emitting region, the organic electroluminescent structure including a first electrode layer, an organic luminescent functional layer and a second electrode layer stacked on the base substrate, the second electrode layer including a first portion in the light-emitting region and a second portion in (Continued)

the non-light-emitting region, and a plurality of organic/inorganic material layers are provided between the second electrode layer and the base substrate, the plurality of organic/inorganic material layers including at least the organic luminescent functional layer in the light-emitting region and including a transparent material layer in the non-light-emitting regions of parts of pixel units.

20 Claims, 6 Drawing Sheets

(51) Int. Cl.
      *H01L 51/00* (2006.01)
      *H01L 51/52* (2006.01)
(52) U.S. Cl.
      CPC ...... *H01L 51/0021* (2013.01); *H01L 51/5228* (2013.01); *H01L 51/5234* (2013.01); *H01L 51/56* (2013.01); *H01L 2227/323* (2013.01); *H01L 2251/5315* (2013.01); *H01L 2251/558* (2013.01)

(58) Field of Classification Search
      CPC ......... H01L 2251/558; H01L 2227/323; H01L 2251/5315
      See application file for complete search history.

(56) References Cited

FOREIGN PATENT DOCUMENTS

| | | |
|---|---|---|
| CN | 101752400 A | 6/2010 |
| CN | 103035667 A | 4/2013 |

OTHER PUBLICATIONS

English translation of Box No. V from the Written Opinion of the International Search Report for International Patent Application No. PCT/CN2015/085769, 2 pages.
First Office Action, including Search Report, for Chinese Patent Application No. 201510151619.7, dated May 4, 2017, 9 pages.

\* cited by examiner

ORGANIC ELECTROLUMINESCENT DISPLAY SUBSTRATE AND MANUFACTURING METHOD THEREOF, AND DISPLAY DEVICE

CROSS-REFERENCE TO RELATED APPLICATION

This application is a Section 371 National Stage Application of International Application No. PCT/CN2015/085769, filed on Jul. 31, 2015, entitled "ORGANIC ELECTROLUMINESCENT DISPLAY SUBSTRATE AND MANUFACTURING METHOD THEREOF, AND DISPLAY DEVICE", which has not yet published, which claims priority to Chinese Application No. 201510151619.7, filed on Apr. 1, 2015, incorporated herein by reference in their entirety.

BACKGROUND OF THE INVENTION

Field of the Invention

Embodiments of the present invention generally relate to a field of transparent display technology, more particularly, relate to an organic electroluminescent display substrate with an improved light transmittance, a manufacturing method thereof, and a display device comprising the organic electroluminescent display substrate.

Description of the Related Art

Transparent display is a new display technology, which enables an observer to observe a background behind a display screen through the screen, thereby extending application fields of the display to display devices, such as a television, a cellphone, a laptop, a display window, a refrigerator door, a vehicle display, a billboard and so on.

An organic electroluminescent device, such as an organic light-emitting diode (OLED), including an active matrix organic light-emitting diode (AMOLED), has characteristics, such as self-illumination, high luminance, high resolution, wide visual angle, fast response speed, low power consumption, capability of being applied to flexible display and so on, and it is a display device which facilitates realizing a transparent display. In the organic electroluminescent device, in order to facilitate realizing a transparent display, each pixel unit in the organic electroluminescent device comprises a light-emitting region and a non-light-emitting region, wherein an electroluminescent structure is formed in the light-emitting region, and non-light-emitting regions of parts of pixel units can be used to realize the transparent display.

With regard to the OLED display device, there are mainly two manners to increase a transparency of the display device so as to realize the transparent display. One manner is to change a structure of a pixel circuit by reducing an area of non-transparent layers or structures (for example, active layer and metal wires) as much as possible, so that an area of a transparent window is increased to increase the transparency of the display panel. The other manner is to replace the metal wires and a cathode of the device to be manufactured with transparent conductive material so as to increase the transparency of the panel. A transparent cathode is very important during preparing the transparent OLED, because it is not only related with performances of the device, but also affects the transparency particularly. In a top-emitting device, the transparent cathode is typically made of thin metal or metallic oxide. The metallic oxide has a high transmittance, however, a sputtering process which is used to form the metallic oxide cathode is apt to damage the OLED device. The thin metal cathode is prepared through an evaporation process, which is simpler and is easy for mass production, so that many designs employ thin metal or metal alloy (for example, Mg and Ag alloy) to manufacture the cathode, and the transmittance of the panel may be increased, for example, by adjusting a doping ratio of Mg and Ag.

In the electroluminescent device in the prior art, however, there are various organic and inorganic protective layers or insulation layers. Though these layers are transparent in the non-light-emitting region, they still cause light loss and transmittance reduction in the non-light-emitting region, leading to a poor transparent display effect of the organic electroluminescent device. The transmittance of the device may be increased by removing a part of or all the organic and inorganic protective layers in the non-light-emitting region, however, a large gradient will be generated at an interface between the light-emitting region and the non-light-emitting region due to a difference in film thickness, thus the thin layer cathode may be broken at the interface, causing the device cannot be activated. Moreover, the transmittance of the light-emitting region will be affected if increasing the thickness of the cathode.

SUMMARY OF THE INVENTION

The present disclosure is proposed in order to overcome at least one of the above and other problems and defects in the prior art.

According to an aspect of the present disclosure, it is provided an organic electroluminescent display substrate comprising a base substrate and a plurality of pixel units formed on the base substrate, the pixel unit comprising a light-emitting region and a non-light-emitting region, wherein an organic electroluminescent structure is formed in the light-emitting region, the organic electroluminescent structure comprising a first electrode layer, an organic luminescent functional layer and a second electrode layer stacked on the base substrate, the second electrode layer comprising a first portion in the light-emitting region and a second portion in the non-light-emitting region, and wherein a plurality of organic/inorganic material layers are provided between the second electrode layer and the base substrate, the plurality of organic/inorganic material layers comprising at least the organic luminescent functional layer in the light-emitting region and comprising a transparent material layer in the non-light-emitting regions of parts of pixel units.

In the organic electroluminescent display substrate, the transparent material layer is formed such that the spacing between the second portion and the base substrate is less than or equal to the spacing between the first portion and the base substrate.

In the organic electroluminescent display substrate, the transparent material layer comprises an electrically conductive layer which contacts the second portion directly.

In the organic electroluminescent display substrate, the electrically conductive layer is made of metallic oxide material.

In the organic electroluminescent display substrate, the metallic oxide material may comprise at least one of ITO and IZO.

In the organic electroluminescent display substrate, the thickness of the transparent material layer may be less than or equal to the thickness of at least one of other layers of the plurality of organic/inorganic material layers in the light-emitting region or the total thicknesses of multiple other layers of the plurality of organic/inorganic material layers in the light-emitting region.

In the organic electroluminescent display substrate, the plurality of organic/inorganic material layers may further comprise a planarization layer formed above the base substrate and a pixel defining layer defining the plurality of pixel units, the first electrode layer being formed on the planarization layer and the pixel defining layer covering the planarization layer so that the first electrode layer is exposed at least partially in an opening of the pixel defining layer, the organic luminescent functional layer covering the pixel defining layer and the first electrode layer.

In the organic electroluminescent display substrate, the pixel unit may further comprise a thin film transistor formed between the base substrate and the organic electroluminescent structure, and the plurality of organic/inorganic material layers may further comprise a semiconductor active layer and a gate insulation layer of the thin film transistor and a passivation layer covering the thin film transistor.

In the organic electroluminescent display substrate, the plurality of organic/inorganic material layers may further comprise: an interlayer insulation layer forming the thin film transistor, the interlayer insulation layer being provided on the gate insulation layer and covering a gate electrode of the thin film transistor; and/or a buffer layer formed between the thin film transistor and the base substrate.

In the organic electroluminescent display substrate, the transparent material layer may be disposed between two adjacent other layers of the plurality of organic/inorganic material layers in the non-light-emitting region.

According to another aspect of the present disclosure, it is provided a manufacturing method of an organic electroluminescent display substrate which comprises a plurality of pixel units arranged in an array, each of the pixel units comprising a light-emitting region and a non-light-emitting region, the manufacturing method comprising steps of:

providing a base substrate; and forming a plurality of organic/inorganic material layers and an organic electroluminescent structure on the base substrate, wherein, the organic electroluminescent structure is located in the light-emitting region and comprises a first electrode layer, an organic luminescent functional layer and a second electrode layer stacked on the base substrate, the second electrode layer comprising a first portion in the light-emitting region and a second portion in the non-light-emitting region, and wherein, the plurality of organic/inorganic material layers are located between the second electrode layer and the base substrate, the plurality of organic/inorganic material layers comprising at least the organic luminescent functional layer in the light-emitting region and comprising a transparent material layer in the non-light-emitting regions of parts of pixel units.

In the above method, the transparent material layer may be formed such that the spacing between the second portion and the base substrate is less than or equal to the spacing between the first portion and the base substrate.

In the above method, the transparent material layer may be formed in the non-light-emitting region after a part of at least one of other layers of the plurality of organic/inorganic material layers in the non-light-emitting region is removed.

In the above method, the step of forming a plurality of organic/inorganic material layers and an organic electroluminescent structure on the base substrate may comprise:

forming a planarization layer, a pixel defining layer, a first electrode layer and an organic luminescent functional layer in order on the base substrate in a stacked manner, so that the first electrode layer is located in the light-emitting region of the pixel unit, the plurality of organic/inorganic material layers further comprising the planarization layer and the pixel defining layer;

removing a part of at least one of the planarization layer, the pixel defining layer and the organic luminescent functional layer in the non-light-emitting region of the pixel unit after the at least one layer is formed;

forming the transparent material layer in the non-light-emitting region of the pixel unit; and forming the second electrode layer in the light-emitting region and the non-light-emitting region of the pixel unit.

In the above method, the at least one layer may comprise the organic luminescent functional layer, and the step of forming the transparent material layer may comprise forming the transparent material layer in a location where the part of the organic luminescent functional layer is removed.

In the above method, the transparent material layer may be formed from an electrically conductive layer and contacts directly the second portion of the second electrode layer in the non-light-emitting region.

In the above method, the electrically conductive layer may be made of metallic oxide material.

In the above method, the metallic oxide material may comprise at least one of ITO and IZO.

In the above method, the thickness of the transparent material layer may be less than or equal to the thickness of at least one of other layers of the plurality of organic/inorganic material layers in the light-emitting region or the total thicknesses of multiple other layers of the plurality of organic/inorganic material layers in the light-emitting region.

The above method may further comprise a step of forming a thin film transistor on the base substrate in each pixel unit before the planarization layer is formed, and the plurality of organic/inorganic material layers may further comprise a semiconductor active layer and a gate insulation layer of the thin film transistor and a passivation layer covering the thin film transistor.

In the above method, the step of forming the thin film transistor may comprise: forming an interlayer insulation layer on the gate insulation layer to cover a gate electrode of the thin film transistor, and forming source/drain electrodes on the interlayer insulation layer and in the light-emitting region of the pixel unit, the plurality of organic/inorganic material layers further comprising the interlayer insulation layer; and/or the manufacturing method may further comprise a step of forming a buffer layer on the base substrate before the thin film transistor is formed, the plurality of organic/inorganic material layers further comprising the buffer layer.

According to a further aspect of the present disclosure, it is provided a manufacturing method of an organic electroluminescent display substrate, comprising steps of:

providing a base substrate;

forming a first electrode layer of an organic electroluminescent structure and at least one organic/inorganic material layer comprising at least an organic luminescent functional layer of the organic electroluminescent structure on the base substrate;

removing a part of at least one of the at least one organic/inorganic material layer in non-light-emitting regions of parts of pixel units;

forming a transparent material layer in the non-light-emitting regions of the parts of pixel units; and forming a second electrode layer of the organic electroluminescent structure in the light-emitting region and the non-light-emitting region of the pixel unit, so that the second electrode layer comprises a first portion in the light-emitting region and a second portion in the non-light-emitting region.

In the above method, the thickness of the transparent material layer is less than or equal to the thickness of at least one of the at least one organic/inorganic material layer in the light-emitting region or the total thicknesses of multiple layers of the at least one organic/inorganic material layer in the light-emitting region.

In the above method, the step of removing the part of at least one of the at least one organic/inorganic material layer in non-light-emitting regions of parts of pixel units is performed immediately after the at least one layer is formed, or all the desired removed organic/inorganic material layers in the non-light-emitting region are removed simultaneously.

According to another further aspect of the present disclosure, it is provided a display device comprising the organic electroluminescent display substrate as described above or manufactured by the above method.

Other objects and advantages of the present disclosure will become more apparent by further explaining the present disclosure in detail with reference to the accompanying drawings below, which aids in understanding the present disclosure completely.

BRIEF DESCRIPTION OF THE DRAWINGS

The features and advantages of the present disclosure will be understood more clearly with reference to the accompanying drawings, which are only illustrative and should not be understood as limiting the present disclosure. The same or similar reference numerals in the drawings indicate the same or similar components, in which.

DETAILED DESCRIPTION OF PREFERRED EMBODIMENTS OF THE INVENTION

In the following detailed description, in order to facilitate the explanation, a number of specific details are explained to provide a comprehensive understanding to the embodiments of the present disclosure. However, it is obvious that one or more embodiments may be implemented without these specific details. In other cases, conventional structures and devices are shown in schematic diagrams to simplify the drawings.

According to a general concept of the present disclosure, an organic electroluminescent display substrate is provided. A part of non-transparent or low-transparent organic/inorganic material layers are removed in non-light-emitting regions of parts of pixel units (i.e. a region for light transmission or transparent display) and an additional transparent material layer is formed, for example, in a location where the material is removed, so that the light transmittance of the region for light transmission or transparent display can be increased and a difference in layer thickness between the light-emitting region and the non-light-emitting region can be reduced, thereby preventing a thin layer cathode from being broken at an interface between the light-emitting and the non-light-emitting region.

Figure 1:
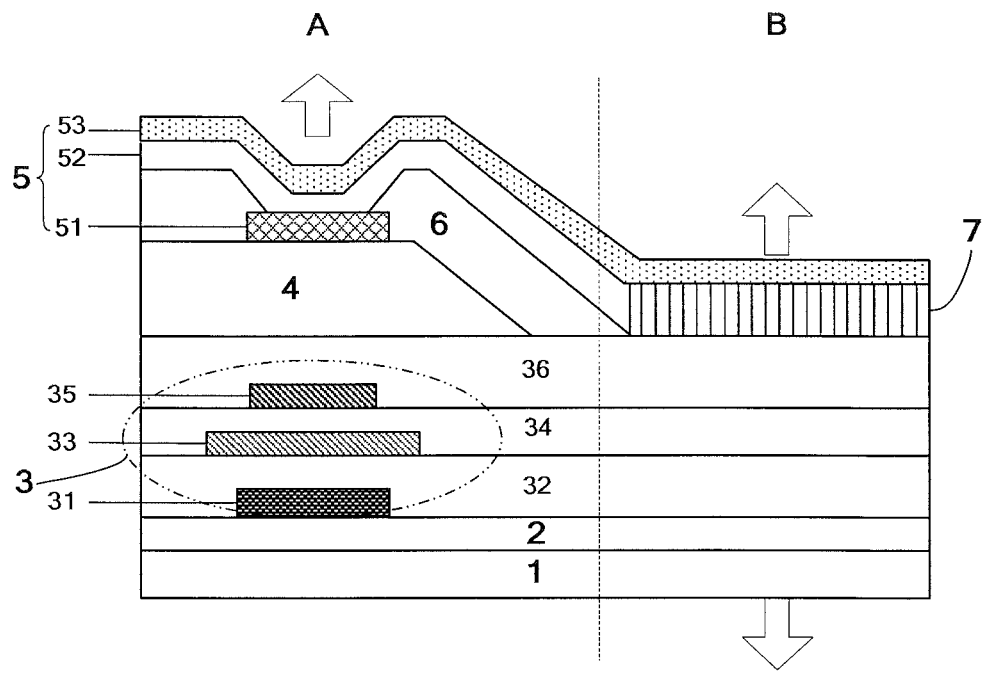
FIG. 1 is a cross section view schematically showing a structure of an organic electroluminescent display substrate according to an embodiment of the present disclosure.

FIG. 1 shows schematically a structure of an organic electroluminescent display substrate according to an embodiment of the present disclosure. The organic electroluminescent display substrate comprises a plurality of pixel units arranged in an array, such as R, G, B sub-pixels. Each of the pixel units comprises a light-emitting region A and a non-light-emitting region B. As shown in FIG. 1, the organic electroluminescent display substrate emits light in an upward direction as indicated by an arrow in the light-emitting region A, thus it is a top-emitting luminescent device. It should be understood that the organic electroluminescent display substrate may also be a bottom-emitting or double faces emitting luminescent device. The following embodiments of the present disclosure will be explained by taking the top-emitting luminescent device as an example.

As shown in FIG. 1, each of the pixel units of the organic electroluminescent display substrate comprises a base substrate 1, and a planarization layer 4, a first electrode layer 51, a pixel defining layer 6, an organic luminescent functional layer 52 and a second electrode layer 53 which are stacked on the base substrate 1 in order. The first electrode layer 51, the organic luminescent functional layer 52 and the second electrode layer 53 constitute an organic electroluminescent structure 5 such as a light emitting diode, in which the first electrode layer 51 and the second electrode layer 53 form an anode and a cathode of the electroluminescent structure 5, respectively. For example, in a case of top-emitting organic electroluminescent display substrate, the anode may be made of metal material or other conductive material; the cathode may be transparent or semitransparent, and may be a thin layer electrode made of metal, metal alloy or metallic oxide; the organic luminescent functional layer is typically a composite multilayer structure, for example, including a hole injection layer, a hole transport layer, an organic luminescent layer, an electron transport layer and an electron injection layer.

As shown in FIG. 1, the first electrode layer 51 is located in the light-emitting region A of the pixel unit rather than in the non-light-emitting region B. The second electrode layer 53 is located in both the light-emitting region A and the non-light-emitting region B of the pixel unit, that is, it comprises a first portion located in the light-emitting region A and a second portion located in the non-light-emitting region B. According to certain embodiments, in parts of pixel units, a portion of at least one organic/inorganic material layer, for example the planarization layer 4, the pixel defining layer 6 and the organic luminescent functional layer 52, in the non-light-emitting region B is removed, as a result, the at least one organic/inorganic material layer is only located in the light-emitting region A of the pixel unit. A transparent material layer 7 is formed at least in the location where the material is removed, in the non-light-emitting region B of the pixel unit, that is, the transparent material layer 7 at least replaces a part of the organic/inorganic material layer removed in the non-light-emitting region B, for example, the thickness of the transparent material layer is less than or equal to the thickness of removed material. According to the embodiment of the present disclosure, the transparent material layer 7 is only formed between the base substrate 1 and the second portion of the second electrode layer 53 in the non-light-emitting region B to replace at least the organic and/or inorganic material layer removed in the non-light-emitting region B.

As the transparent material layer 7 is used to replace at least the organic/inorganic material layer removed in the non-light-emitting region, the transparent material layer is formed such that a spacing between the base substrate 1 and the second portion of the second electrode layer 53 is less than or equal to a spacing between the base substrate 1 and the first portion of the second electrode layer 53. In other words, the thickness of the transparent material layer is less than or equal to the thickness of at least one of other organic/inorganic material layers in the light-emitting region, or is less than or equal to the total thicknesses of at least two of other organic/inorganic material layers in the light-emitting region, so that the region for transmitting light or transparent display is substantially flush with or slightly lower than the light-emitting region. For example, the thickness of the transparent material layer 7 may be less than or equal to the thickness of one of the removed planarization layer 4, the pixel defining layer 6 and the organic luminescent functional layer 52, or may be less than or equal to the total thicknesses of two or more of these removed layers.

If parts of the planarization layer 4, the pixel defining layer 6 and the organic luminescent functional layer 52 in the non-light-emitting region B are removed, a large gradient will be generated at the interface between the light-emitting region A and the non-light-emitting region B, that is, the difference in layer thickness between the light-emitting region A and the non-light-emitting region B is large. In this case, the thin layer cathode, such as the second electrode layer 53, may be broken at the interface, which causes the luminescent device cannot be activated. In the certain embodiments, an additional transparent material layer 7 is formed at least in the location where the material is removed in the non-light-emitting region B, so that the light transmittance of the non-light-emitting region B can be increased while the difference in layer thickness between the light-emitting region A and the non-light-emitting region B can be reduced, thereby preventing the thin layer cathode from being broken at the interface.

According to an exemplary embodiment of the present disclosure, the transparent material layer 7 may be an electrically conductive layer formed of electrically conductive material, and the conductive layer contacts directly a part of the second electrode layer 53 in the non-light-emitting region. In this case, the conductive transparent material layer 7 is able to increase the light transmittance and reduce the gradient, also to reduce an area resistance of the second electrode layer or the cathode 53 so as to reduce the power consumption of the device. The used electrically conductive material may be metallic oxide material, for example, including at least one of indium tin oxide (ITO) and indium-doped zinc oxide (IZO).

The organic electroluminescent display substrate according to the present disclosure may be an active matrix organic light emitting diode (OLED) device, in which each pixel unit comprises at least one thin film transistor, such as switching transistor or drive transistor. As shown in FIG. 1, the organic electroluminescent display substrate comprises a thin film transistor structure 3 formed between the base substrate 1 and the planarization layer 4, and the thin film transistor structure 3 may comprise:

a semiconductor active layer 31 formed on the base substrate 1 and located in the light-emitting region A of the pixel unit;

a gate insulation layer 32 formed on the base substrate 1 and covering the semiconductor active layer 31;

a gate electrode 33 formed on the gate insulation layer 32 and located in the light-emitting region A of the pixel unit;

an interlayer insulation layer 34 formed on the gate electrode 33 and covering the gate electrode 33;

source/drain electrodes 35 formed on the interlayer insulation layer 34 and located in the light-emitting region A of the pixel unit; and a passivation layer 36 formed on the interlayer insulation layer 34 and covering the source/drain electrodes 35.

It can be seen that, in the AMOLED device, a plurality of film layers forming the thin film transistor, such as the gate insulation layer, the interlayer insulation layer, the passivation layer and the like, are not only formed in the light-emitting region A, but also formed in the non-light-emitting region B. Though these film layers have certain light transmittances, they cause a light loss and reduce the light transmittance in the non-light-emitting region, thereby leading to a poor transparent display effect of the organic electroluminescent display substrate. According to the present disclosure, like the organic/inorganic material layers of the luminescent structure, at least one of a plurality of organic/inorganic material layers forming the thin film transistor, such as the gate insulation layer, the interlayer insulation layer and the passivation layer, may only be formed in the light-emitting region of the pixel unit, that is, a part of the layer in the non-light-emitting region is removed. Further, the transparent material layer may be additionally formed in the location where the part of the layer in the non-light-emitting region is removed, so as to increase the light transmittance and reduce the gradient or the difference in thickness.

Figure 2:
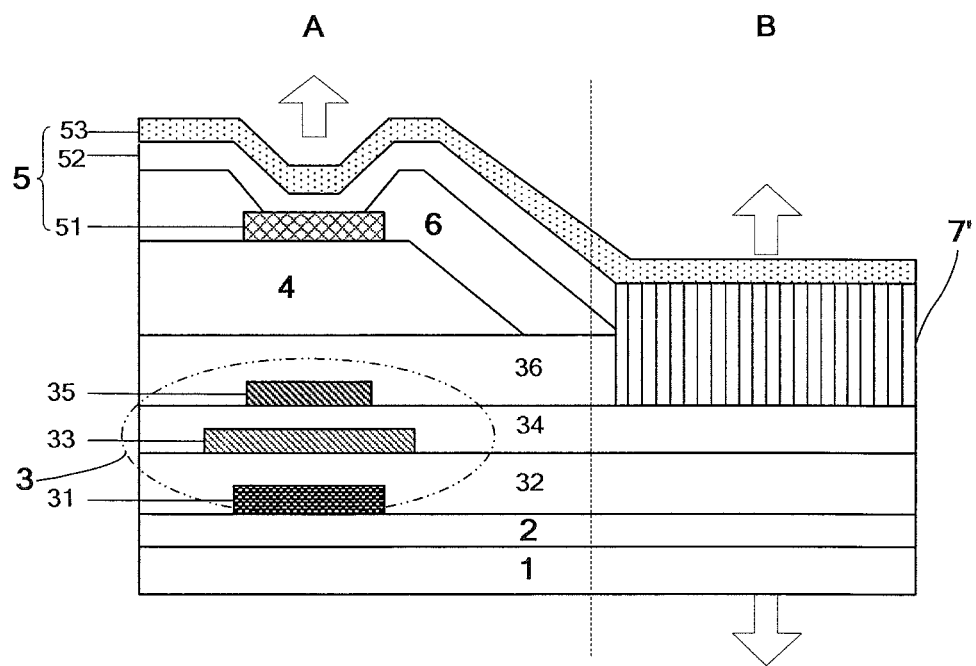
FIG. 2 is a cross section view schematically showing a structure of an organic electroluminescent display substrate according to another embodiment of the present disclosure.

FIG. 2 shows schematically a structure of an organic electroluminescent display substrate according to another embodiment of the present disclosure, in which a part of the passivation layer 36 in the non-light-emitting region B is removed and is replaced with a transparent material layer 7'. It can be seen that, in the structure as shown in FIG. 2, parts of the organic luminescent functional layer 52 of the AMOLED device, the pixel defining layer 6, the planarization layer 4 and the passivation layer 36 in the non-light-emitting region B for light transmission or transparent display are removed, for example, are etched through a patterning process, and a transparent material layer 7' is formed in locations where these parts in the non-light-emitting region B are removed. The thickness of the transparent material layer 7' may be less than or equal to the total thicknesses of these removed layers, for example, is substantially equal to the total thicknesses of the organic luminescent functional layer 52 and the passivation layer 36, as shown in FIG. 2.

Figure 3:
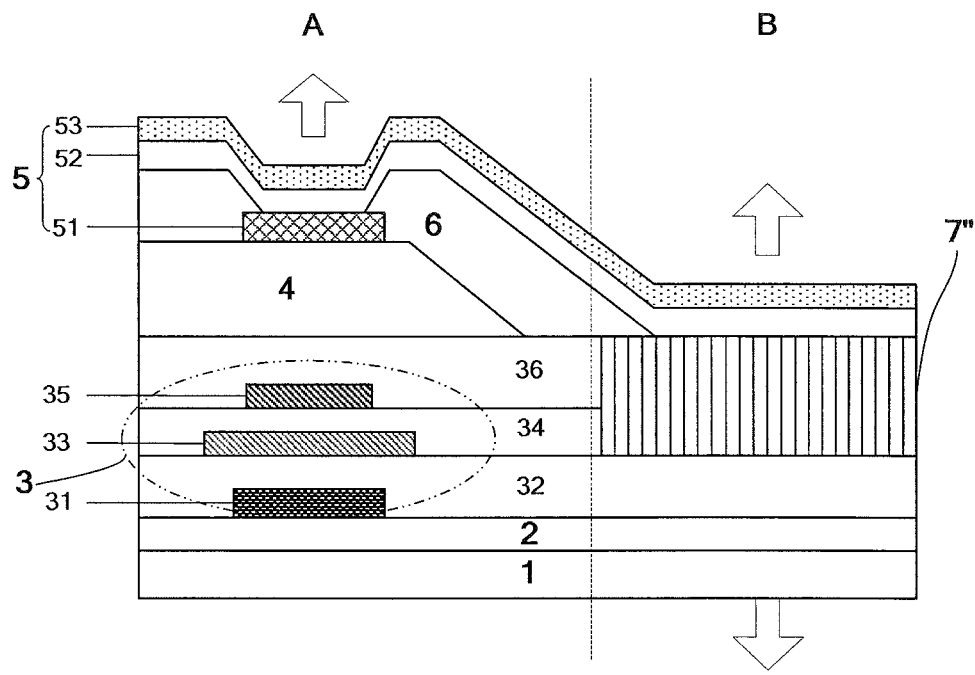
FIG. 3 is a cross section view schematically showing a structure of an organic electroluminescent display substrate according to another embodiment of the present disclosure.
Figure 4:
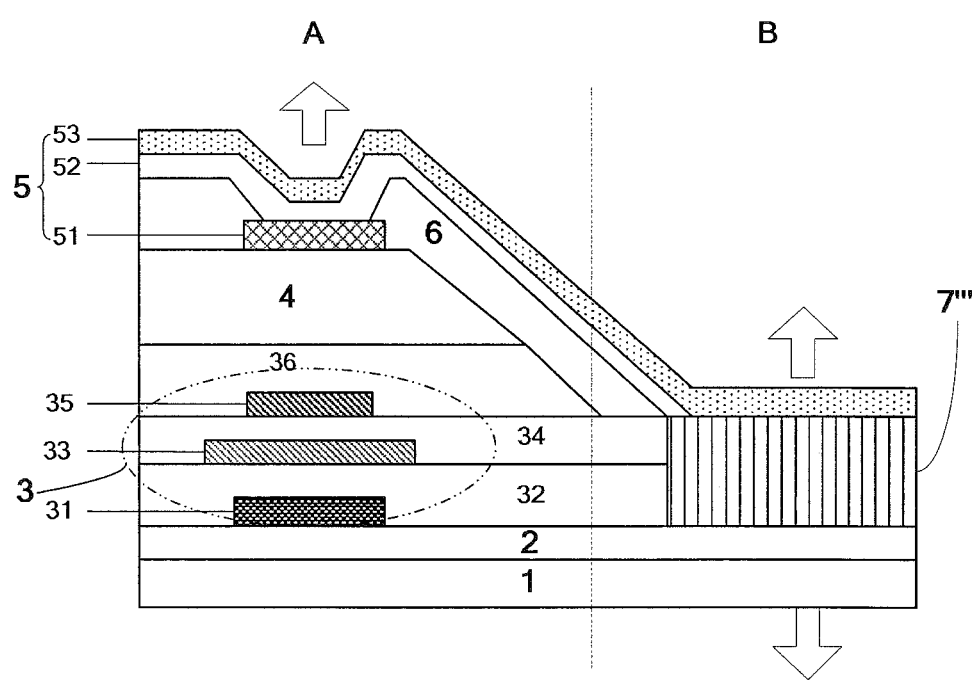
FIG. 4 is a cross section view schematically showing a structure of an organic electroluminescent display substrate according to another embodiment of the present disclosure.

In the embodiment as shown in FIG. 3, the thickness of the transparent material layer 7" is substantially equal to the total thicknesses of the passivation layer 36 and the interlayer insulation layer 34. In the embodiment as shown in FIG. 4, the thickness of the transparent material layer 7''' is substantially equal to the total thicknesses of the interlayer insulation layer 34 and the gate insulation layer 32. It should be understood that the thickness of the additional transparent material layer in the non-light-emitting region of the light emitting device according to the present disclosure may be suitably set if required, as long as increasing the light transmittance of the region for light transmission or transparent display and reducing the gradient or the difference in thickness.

Figure 5:
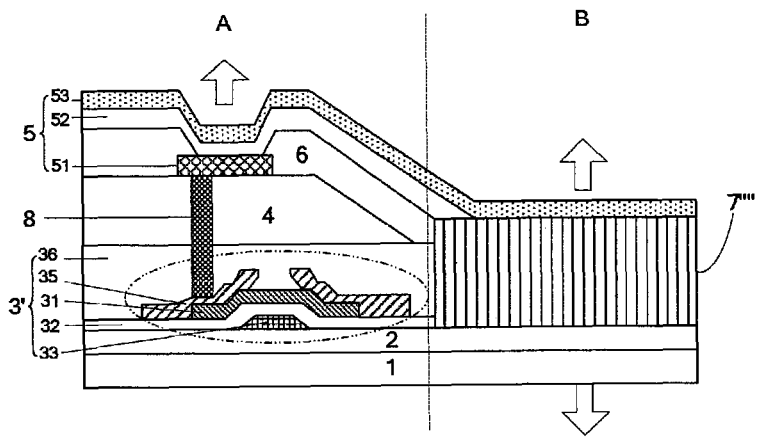
FIG. 5 is a cross section view schematically showing a structure of an organic electroluminescent display substrate according to another embodiment of the present disclosure.

In the embodiments as shown in FIGS. 1-4, the thin film transistor 3 has a top-gate structure. Alternatively, the thin film transistor in the organic electroluminescent display substrate according to the present disclosure may have a bottom-gate structure, as shown in FIG. 5. In an embodiment as shown in FIG. 5, the bottom-gate thin film transistor 3' comprises:

a gate electrode 33 formed above the base substrate 1 and located in the light-emitting region A of the pixel unit;

a gate insulation layer 32 formed on the base substrate 1 and covering the gate electrode 33;

a semiconductor active layer 31 formed on the gate insulation layer 32 and located in the light-emitting region A of the pixel unit;

source/drain electrodes 35 formed on the semiconductor active layer 31 and located in the light-emitting region A of the pixel unit; and a passivation layer 36 formed on the gate insulation layer 32 and covering at least the source/drain electrodes 35 and the semiconductor active layer 31.

As shown in FIG. 5, an electrically conductive path 8 may be formed through the passivation layer 36 and the planarization layer 4. One of the source and drain electrodes of the thin film transistor 3' may be electrically connected to the first electrode layer 51 through the conductive path 8 so as to drive the organic electroluminescent structure 5 to emit light.

At least one of the gate insulation layer 32 and the passivation layer 36 may be only formed in the light-emitting region A of the pixel unit. In the structure as shown in FIG. 5, parts of the organic luminescent functional layer 52, the pixel defining layer 6, the planarization layer 4, the gate insulation layer 32 and the passivation layer 36 in the non-light-emitting region B of the pixel unit are removed and are replaced with a transparent material layer 7''', which is able to increase the light transmittance of the non-light-emitting region B for light transmission or transparent display and reduce the gradient or the difference in thickness at the interface between the light-emitting region A and the non-light-emitting region B.

Similarly, as shown in FIGS. 2, 4 and 5, the transparent material layer 7', 7'', 7''' may contact the second electrode layer or the cathode 53 directly, preferably, it may be an electrically conductive layer to reduce the area resistance of the second electrode layer or the cathode 53. Alternatively, the transparent material layer contacting the second electrode layer 53 may not be an electrically conductive layer, or may not contact the second electrode layer 53 as shown in FIG. 3. In these cases, the additional transparent material layer is formed in the non-light-emitting region B to increase the light transmittance of the non-light-emitting region B and reduce the gradient at the interface between the light-emitting region A and the non-light-emitting region B, thereby preventing the thin cathode from being broken at the interface.

In the organic electroluminescent display substrate, there may be other organic/inorganic material layers, parts of one or more of which in the non-light-emitting region may be removed and replaced with the transparent material layer. For example, as shown in FIGS. 1-5, a buffer layer 2 may further formed between the thin film transistor 3, 3' and the base substrate 1. As an example, the buffer layer 2 may only be provided in the light-emitting region A of the pixel unit.

Moreover, the additional transparent material layer in the non-light-emitting region is continuous in the organic electroluminescent display substrate as shown in FIGS. 1-5, however, it should be understood that such additional transparent material layer may also comprise a plurality of sub-layers which are not continuous or spaced apart from each other. Each of the sub-layers is used to replace with one or more organic/inorganic material layers in the non-light-emitting region in the existed organic electroluminescent display substrate, or has a thickness which is substantially equal to the thickness or the total thicknesses of one or more organic/inorganic material layers.

Figure 6:
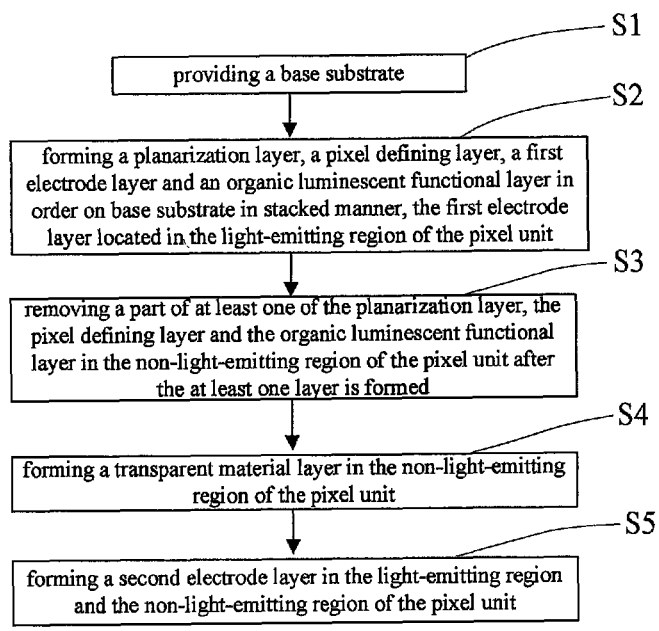
FIG. 6 is a flow chart schematically showing a manufacturing method of an organic electroluminescent display substrate according to an exemplary embodiment of the present disclosure.

Further, the present disclosure provides a manufacturing method of an organic electroluminescent display substrate which comprises a plurality of pixel units arranged in an array, each of the pixel units comprising a light-emitting region and a non-light-emitting region. FIG. 6 schematically shows a flow chart of the manufacturing method of the organic electroluminescent display substrate according to an exemplary embodiment of the present disclosure. The manufacturing method mainly comprises steps of:

S1. providing a base substrate which may be a glass substrate or other transparent substrate;

S2. forming a planarization layer, a pixel defining layer, a first electrode layer and an organic luminescent functional layer in order on the base substrate in a stacked manner, for example, by using deposition, evaporation and patterning processes, the first electrode layer being located in the light-emitting region of the pixel unit;

S3. removing a part of at least one of the planarization layer, the pixel defining layer and the organic luminescent functional layer in the non-light-emitting region of the pixel unit after the at least one layer is formed;

S4. forming a transparent material layer in the non-light-emitting region of the pixel unit, for example, forming the transparent material layer in a location where the part is removed; and S5. forming a second electrode layer in the light-emitting region and the non-light-emitting region of the pixel unit.

In an example, a part of the organic luminescent functional layer in the non-light-emitting region of the pixel unit may be removed after the organic luminescent functional layer is formed, and the transparent material layer formed in the location where the part of the organic luminescent functional layer is removed may be an electrically conductive layer which contacts the part of the second electrode layer in the non-light-emitting region directly. For example, the conductive layer may be made of metallic oxide material. As an example, the metallic oxide material may include at least one of indium tin oxide (ITO) and indium-doped zinc oxide (IZO). Preferably, the thickness of at least a part of the transparent material layer may be substantially equal to the thickness of the removed parts.

The above method may further comprise a step of forming a thin film transistor between the base substrate and the planarization layer in each pixel unit. As for the top-gate thin film transistor, the step may comprise:

forming a semiconductor active layer on the base substrate and in the light-emitting region of the pixel unit;

forming a gate insulation layer on the base substrate to cover the semiconductor active layer;

forming a gate electrode on the gate insulation layer and in the light-emitting region of the pixel unit;

forming an interlayer insulation layer on the gate insulation layer to cover the gate electrode;

forming source/drain electrodes on the interlayer insulation layer and in the light-emitting region of the pixel unit; and forming a passivation layer on the interlayer insulation layer to cover the source/drain electrodes, removing a part of at least one of the gate insulation layer, the interlayer insulation layer and the passivation layer in the non-light-emitting region of the pixel unit after the at least one layer is formed.

As for the bottom-gate thin film transistor, the step may comprise:

forming a gate electrode above the base substrate and in the light-emitting region of the pixel unit;

forming a gate insulation layer on the base substrate to cover the gate electrode;

forming a semiconductor active layer on the gate insulation layer and in the light-emitting region of the pixel unit;

forming source/drain electrodes on semiconductor active layer and in the light-emitting region of the pixel unit; and forming a passivation layer on the gate insulation layer to cover at least the source/drain electrodes and semiconductor active layer, removing a part of at least one of the gate insulation layer and the passivation layer in the non-light-emitting region of the pixel unit after the at least one layer is formed.

In an example, after parts of the gate insulation layer, the interlayer insulation layer and/or the passivation layer in the non-light-emitting region of the pixel unit are removed, an additional transparent material layer may be formed at locations where the parts are removed. The additional transparent material layer may be spaced apart from or integrated with the aforementioned transparent material layer.

It should be understood that, removing parts of the above organic/inorganic material layers of the organic luminescent display substrate in the non-light-emitting region may be performed immediately after the respective layers are formed, or all the desired removed parts of the organic/inorganic material layers in the non-light-emitting region may be removed simultaneously.

Figure 7A:
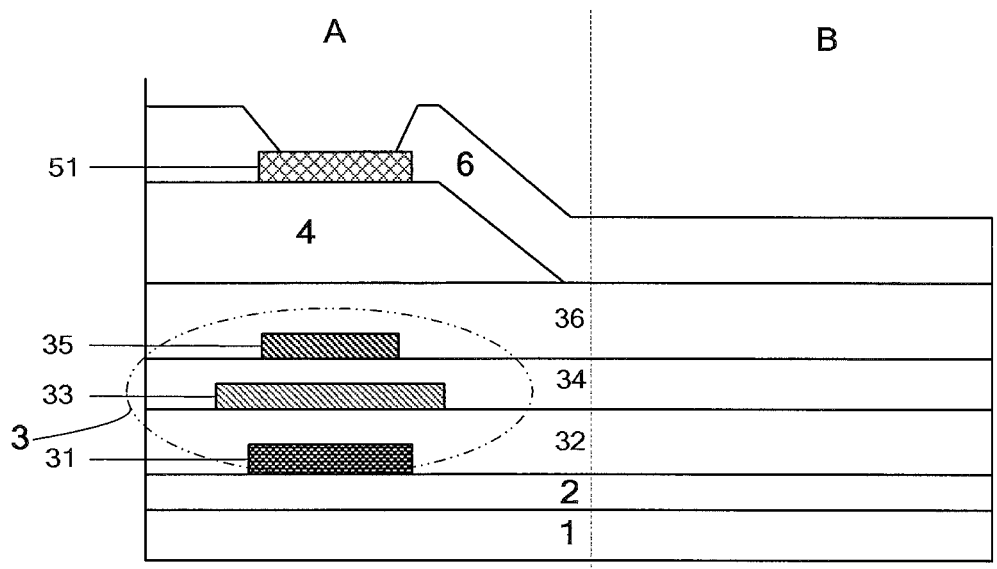
FIGS. 7A-7F are flow diagrams schematically showing processes of a manufacturing method of an organic electroluminescent display substrate according to an exemplary embodiment of the present disclosure.
Figure 7B:
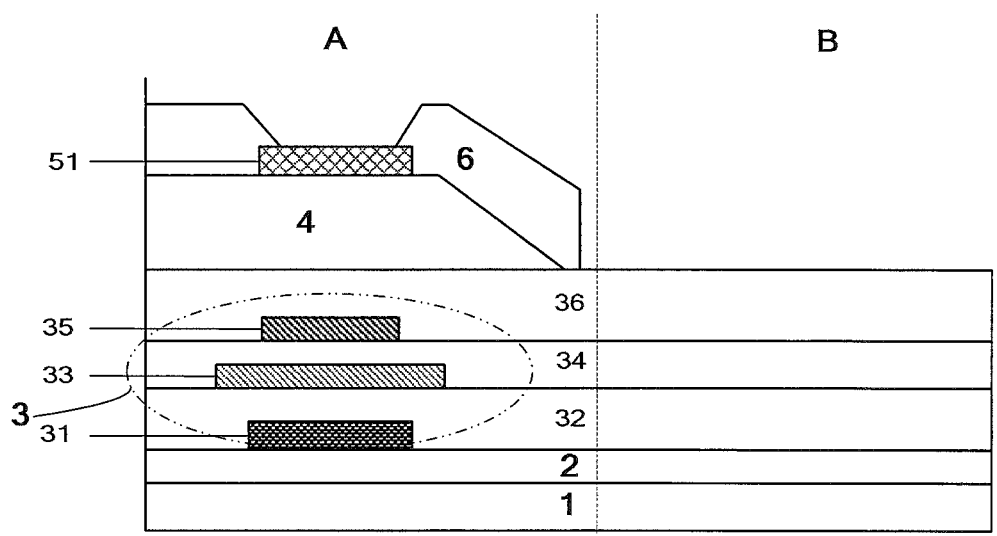
Figure 7C:
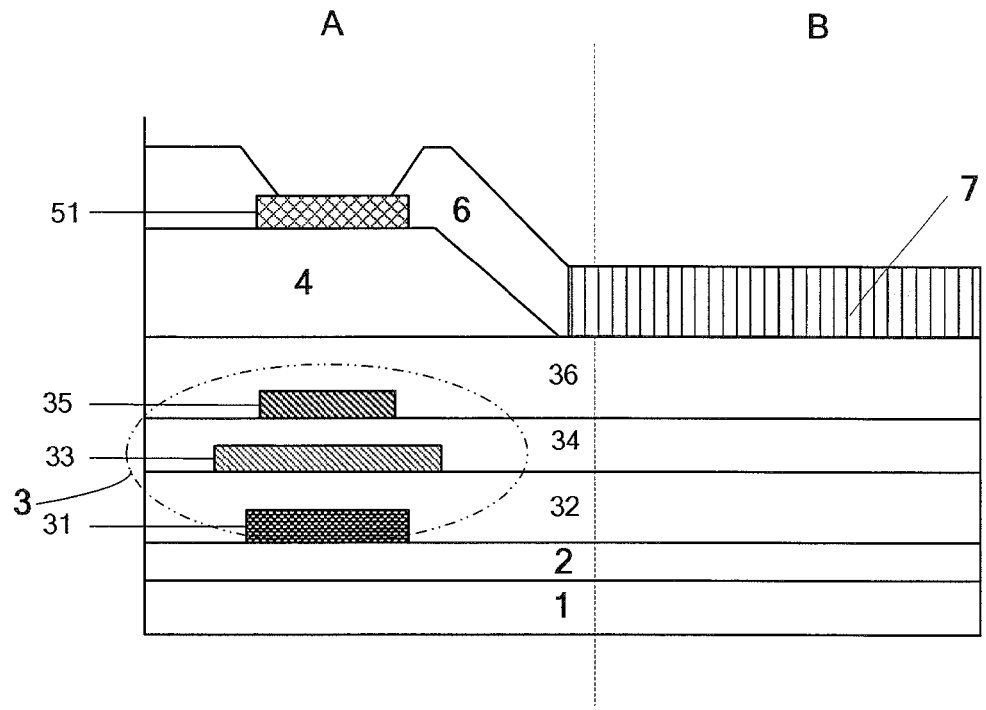
Figure 7D:
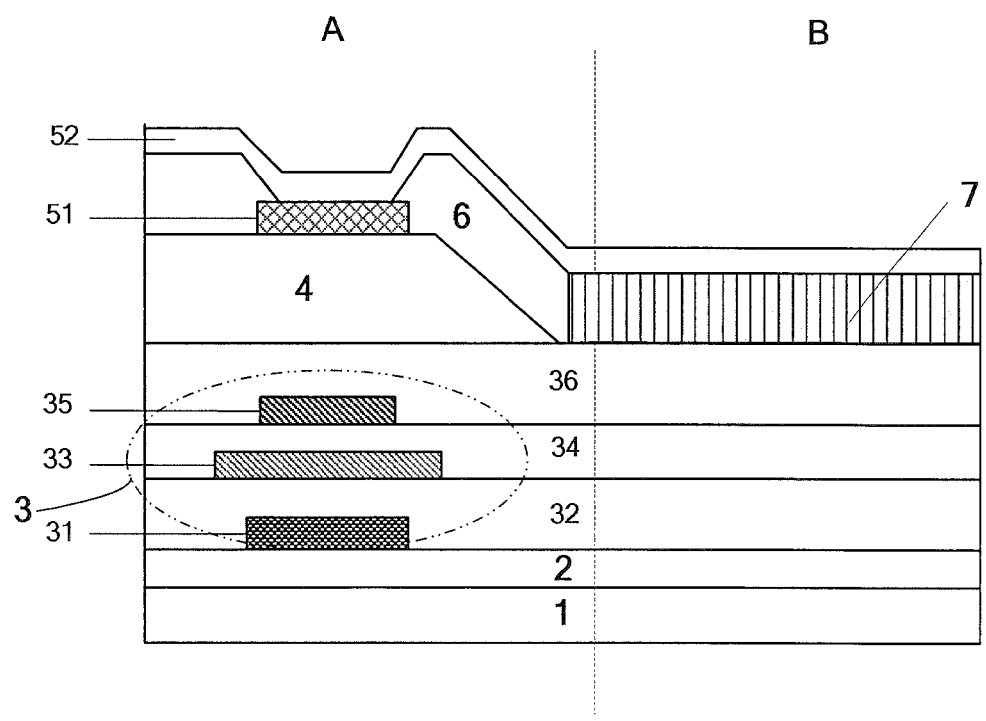
Figure 7E:
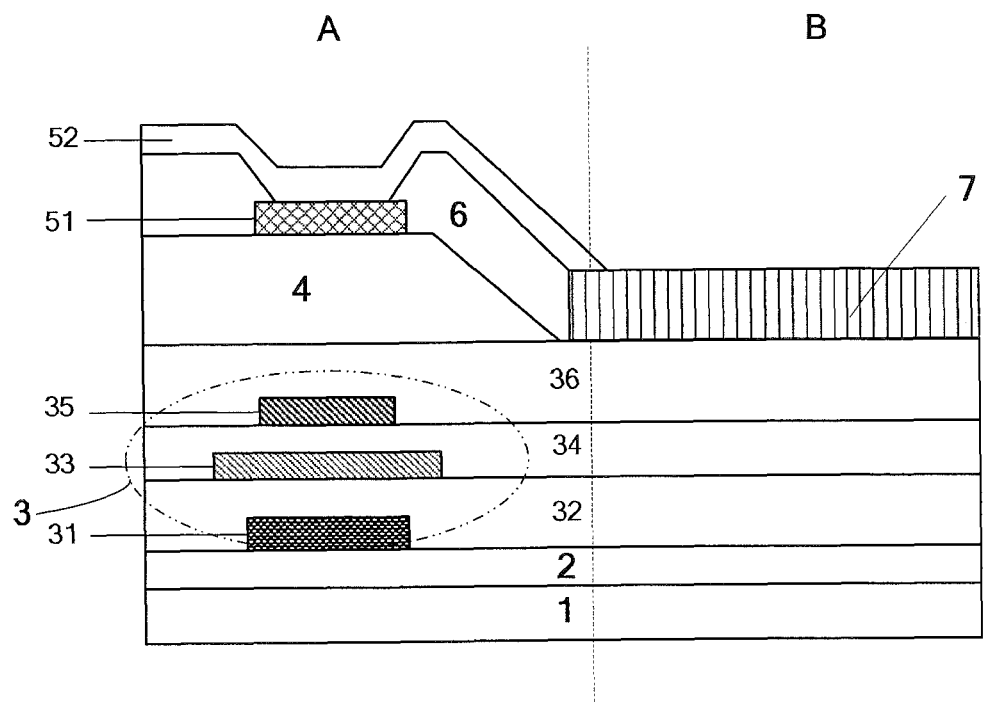
Figure 7F:
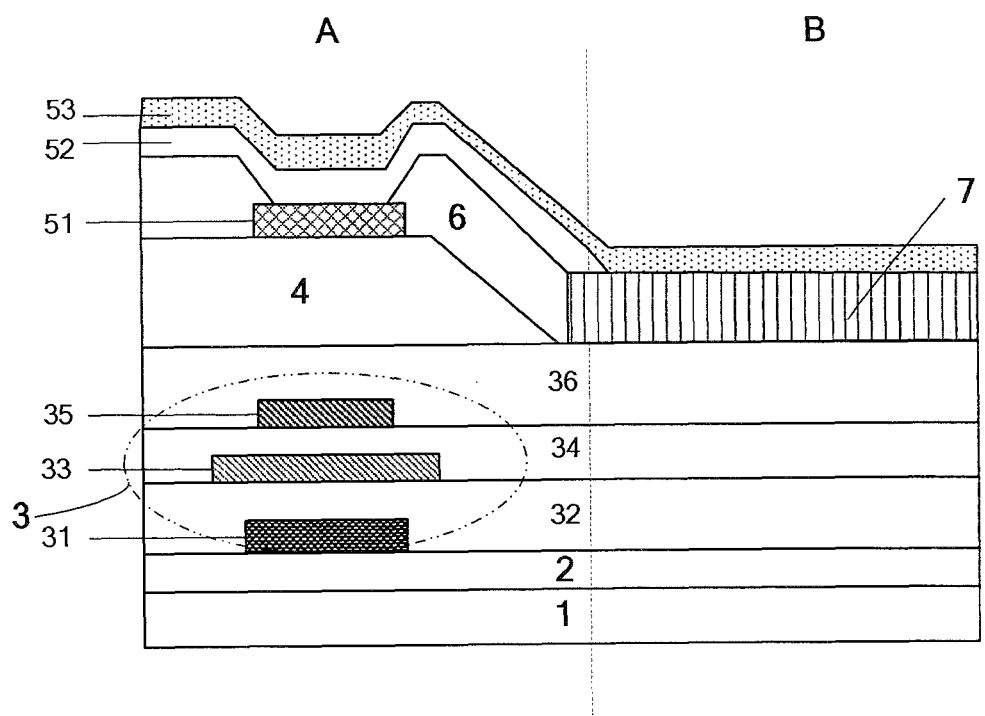

FIGS. 7A-7F are flow diagrams schematically showing a manufacturing method of an organic electroluminescent display substrate according to an exemplary embodiment of the present disclosure. As shown in FIG. 7A, the buffer layer 2, the semiconductor active layer 31, the gate insulation layer 32, the gate electrode 33, the interlayer insulation layer 34, the source/drain electrodes 35, the passivation layer 36, the planarization layer 4, the pixel defining layer 6 and the first electrode layer 51 are firstly formed in order on the base substrate 1 in a stacked manner, for example through deposition or evaporation process, wherein a patterning process is used to pattern the semiconductor active layer 31, the gate electrode 33, the source/drain electrodes 35 and the first electrode layer 51 so that they are only provided in the light-emitting region. As shown in FIG. 7B, a part of the pixel defining layer 6 in the non-light-emitting region B is then removed, for example through patterning process. As shown in FIG. 7C, a transparent material layer 7 is formed in the non-light-emitting region B. Thereafter, as shown in FIG. 7D, the organic luminescent functional layer 52 covering the pixel defining layer 6, the first electrode layer 51 and the transparent material layer 7 is formed. As shown in FIG. 7E, a suitable mask is used to pattern the organic luminescent functional layer 52 so as to remove a part thereof in the non-light-emitting region B. Finally, the second electrode layer or the cathode 53 covering the organic luminescent functional layer 52 and the transparent material layer 7 is formed in both the light-emitting region A and the non-light-emitting region B, for example through an evaporation process.

Further, the present disclosure provides a display device comprising the organic electroluminescent display substrate according to any one of the above embodiments or manufactured by the method according to any one of the above embodiments. The display device may include an AMOLED display device, for example, for a television, a cellphone, a laptop, a display window, a refrigerator door, a vehicle display, a billboard and so on.

Although embodiments of the present disclosure have been illustrated and described, it should be understood that those skilled in the art can make several changes thereto without departing from the principle and spirit of the present disclosure, and the scope of the present invention should be defined by the appended claims and the equivalents thereof.

What is claimed is:

1. An organic electroluminescent display substrate comprising a base substrate and a plurality of pixel units formed on the base substrate, the pixel unit comprising a light-emitting region and a non-light-emitting region, wherein,
an organic electroluminescent structure is formed in the light-emitting region, the organic electroluminescent structure comprising a first electrode layer, an organic luminescent functional layer and a second electrode layer stacked on the base substrate, the second electrode layer comprising a first portion in the light-emitting region and a second portion in the non-light-emitting region, and wherein,
a plurality of organic/inorganic material layers are provided between the second electrode layer and the base substrate, the plurality of organic/inorganic material layers comprising at least the organic luminescent functional layer in the light-emitting region and comprising a transparent material layer in the non-light-emitting regions of parts of the pixel units; and
the transparent material layer is formed so as to reduce a gradient at the interface between the light-emitting region and the non-light-emitting region.

2. The organic electroluminescent display substrate according to claim 1, wherein,
the transparent material layer is formed such that a spacing between the second portion and the base substrate is less than or equal to a spacing between the first portion and the base substrate.

3. The organic electroluminescent display substrate according to claim 2, wherein,
the transparent material layer comprises an electrically conductive layer which contacts the second portion directly.

4. The organic electroluminescent display substrate according to claim 1, wherein,
the thickness of the transparent material layer is less than or equal to the thickness of at least one of other layers of the plurality of organic/inorganic material layers in the light-emitting region or the total thicknesses of multiple other layers of the plurality of organic/inorganic material layers in the light-emitting region.

5. The organic electroluminescent display substrate according to claim 4, wherein,
the plurality of organic/inorganic material layers further comprise a planarization layer formed above the base substrate and a pixel defining layer defining the plurality of pixel units, the first electrode layer being formed on the planarization layer and the pixel defining layer covering the planarization layer so that the first electrode layer is exposed at least partially in an opening of the pixel defining layer, the organic luminescent functional layer covering the pixel defining layer and the first electrode layer.

6. The organic electroluminescent display substrate according to claim 4, wherein,
the pixel unit further comprises a thin film transistor formed between the base substrate and the organic electroluminescent structure, and the plurality of organic/inorganic material layers further comprise a semiconductor active layer and a gate insulation layer of the thin film transistor and a passivation layer covering the thin film transistor.

7. The organic electroluminescent display substrate according to claim 6, wherein, the plurality of organic/inorganic material layers further comprise:
an interlayer insulation layer of the thin film transistor, the interlayer insulation layer being provided on the gate insulation layer and covering a gate electrode of the thin film transistor; and/or
a buffer layer formed between the thin film transistor and the base substrate.

8. The organic electroluminescent display substrate according to claim 1, wherein, the transparent material layer is disposed between two adjacent other layers of the plurality of organic/inorganic material layers in the non-light-emitting region.

9. A manufacturing method of an organic electroluminescent display substrate which comprises a plurality of pixel units arranged in an array, each of the pixel units comprising a light-emitting region and a non-light-emitting region, the manufacturing method comprising steps of:
providing a base substrate; and
forming a plurality of organic/inorganic material layers and an organic electroluminescent structure on the base substrate, wherein,
the organic electroluminescent structure is located in the light-emitting region and comprises a first electrode layer, an organic luminescent functional layer and a second electrode layer stacked on the base substrate, the second electrode layer comprising a first portion in the light-emitting region and a second portion in the non-light-emitting region, and wherein,
the plurality of organic/inorganic material layers are located between the second electrode layer and the base substrate, the plurality of organic/inorganic material layers comprising at least the organic luminescent functional layer in the light-emitting region and comprising a transparent material layer in the non-light-emitting regions of parts of the pixel units; and
the transparent material layer is formed so as to reduce a gradient at the interface between the light-emitting region and the non-light-emitting region.

10. The manufacturing method according to claim 9, wherein,
the transparent material layer is formed such that a spacing between the second portion and the base substrate is less than or equal to a spacing between the first portion and the base substrate.

11. The manufacturing method according to claim 10, wherein,
the transparent material layer is formed in the non-light-emitting region after a part of at least one of other layers of the plurality of organic/inorganic material layers in the non-light-emitting region is removed.

12. The manufacturing method according to claim 11, wherein the step of forming a plurality of organic/inorganic material layers and an organic electroluminescent structure on the base substrate comprises:
forming a planarization layer, a pixel defining layer, a first electrode layer and an organic luminescent functional layer in order on the base substrate in a stacked manner, so that the first electrode layer is located in the light-emitting region of the pixel unit, the plurality of organic/inorganic material layers further comprising the planarization layer and the pixel defining layer;
removing a part of at least one of the planarization layer, the pixel defining layer and the organic luminescent functional layer in the non-light-emitting region of the pixel unit after the at least one layer is formed;
forming the transparent material layer in the non-light-emitting region of the pixel unit; and
forming the second electrode layer in the light-emitting region and the non-light-emitting region of the pixel unit.

13. The manufacturing method according to claim 12, wherein the at least one layer comprises the organic luminescent functional layer, and wherein the step of forming the transparent material layer comprises forming the transparent material layer in a location where the part of the organic luminescent functional layer is removed.

14. The manufacturing method according to claim 13, wherein,
the transparent material layer is formed from an electrically conductive layer and contacts directly the second portion of the second electrode layer in the non-light-emitting region.

15. The manufacturing method according to claim 10, wherein,
the thickness of the transparent material layer is less than or equal to the thickness of at least one of other layers of the plurality of organic/inorganic material layers in the light-emitting region or the total thicknesses of multiple other layers of the plurality of organic/inorganic material layers in the light-emitting region.

16. The manufacturing method according to claim 12, further comprising a step of forming a thin film transistor on the base substrate in each pixel unit before the planarization layer is formed, wherein,
the plurality of organic/inorganic material layers further comprise a semiconductor active layer and a gate insulation layer of the thin film transistor and a passivation layer covering the thin film transistor.

17. The manufacturing method according to claim 16, wherein,
the step of forming the thin film transistor comprises:
forming an interlayer insulation layer on the gate insulation layer to cover a gate electrode of the thin film transistor, and forming source/drain electrodes on the interlayer insulation layer and in the light-emitting region of the pixel unit, the plurality of organic/inorganic material layers further comprising the interlayer insulation layer; and/or
the manufacturing method further comprises a step of forming a buffer layer on the base substrate before the thin film transistor is formed, the plurality of organic/inorganic material layers further comprising the buffer layer.

18. A manufacturing method of an organic electroluminescent display substrate, comprising steps of:

providing a base substrate;

forming a first electrode layer of an organic electroluminescent structure and at least one organic/inorganic material layer comprising at least an organic luminescent functional layer of the organic electroluminescent structure on the base substrate;

removing a part of at least one of the at least one organic/inorganic material layer in non-light-emitting regions of parts of pixel units;

forming a transparent material layer in the non-light-emitting regions of the parts of the pixel units; and forming a second electrode layer of the organic electroluminescent structure in a light-emitting region and the non-light-emitting region of the pixel unit; and the transparent material layer is formed so as to reduce a gradient at the interface between the light-emitting region and the non-light-emitting region.

19. The manufacturing method according to claim 18, wherein, the step of removing the part of at least one of the at least one organic/inorganic material layer in the non-light-emitting regions of parts of pixel units is performed immediately after the at least one layer is formed, or all the desired removed organic/inorganic material layers in the non-light-emitting region are removed simultaneously.

20. A display device, comprising the organic electroluminescent display substrate according to claim 1.

* * * * *